United States Patent [19]
Takano et al.

[11] Patent Number: 5,728,211
[45] Date of Patent: Mar. 17, 1998

[54] SILICON SINGLE CRYSTAL WITH LOW DEFECT DENSITY AND METHOD OF PRODUCING SAME

[75] Inventors: Kiyotaka Takano; Kouji Kitagawa; Eiichi Iino; Masanori Kimura; Hirotoshi Yamagishi, all of Annaka; Masahiro Sakurada, Kouriyama, all of Japan

[73] Assignee: Shin-Etsu Handotai Co., Ltd., Tokyo, Japan

[21] Appl. No.: 660,198

[22] Filed: Jun. 3, 1996

[30] Foreign Application Priority Data

Jun. 9, 1995 [JP] Japan ..................... 7-143391

[51] Int. Cl.⁶ ..................................... C30B 15/20
[52] U.S. Cl. ................ 117/14; 117/15; 117/931; 117/932
[58] Field of Search ............... 117/14, 15, 200, 117/201, 20, 202, 931, 932

[56] References Cited

U.S. PATENT DOCUMENTS

| | | | |
|---|---|---|---|
| 5,129,986 | 7/1992 | Sekij et al. | 117/21 |
| 5,152,867 | 10/1992 | Kitaura et al. | 117/20 |
| 5,485,802 | 1/1996 | Altekrüger et al. | 117/14 |

FOREIGN PATENT DOCUMENTS

| | | |
|---|---|---|
| 0355833 | 2/1990 | European Pat. Off. . |
| 0504837 | 9/1992 | European Pat. Off. . |
| 716168A | 6/1996 | European Pat. Off. . |
| 0258427 | 7/1988 | Germany ............... 117/14 |
| 2-267195 | 10/1990 | Japan . |
| A-2-267195 | 10/1990 | Japan . |
| A-4-192345 | 7/1992 | Japan . |
| 7-61889 | 3/1995 | Japan . |

OTHER PUBLICATIONS

"Submicron Device II-3 Reliability of the Gate Oxide Film" Mitsumasa Koyanagi, published by Maruzen K. K. Tokyo, p. 70.

Shinsuke Sadamitsu et al., "Dependence of the Grown-in Defect Distribution of Growth Rates in Czochralski Silicon," JPN. J. APPL. PHYS., vol. 32, Part 1, No. 9A, Sep. 1993, pp. 3675-3681.

*Primary Examiner*—Felisa Garrett
*Attorney, Agent, or Firm*—Oliff & Berridge, P.L.C.

[57] ABSTRACT

A silicon single crystal having low defects, such as flow pattern defects and laser scattering tomography defects, and high dielectric breakdown strength in oxides and a method of producing the same using the Czochralski technique comprising steps of adjusting a first passage time of a growing crystal for a first temperature range of the melting point to 1,200° C. so as to be 190 min. or shorter and adjusting a second passage time thereof for a second temperature range of 1,150° C. to 1,080° C. so as to be 60 min. or longer during crystal growth.

8 Claims, 9 Drawing Sheets

▲ (A) GRADUAL COOLING IN HIGH TEMPERATURE RANGE
   + RAPID COOLING IN MEDIUM TEMPERATURE RANGE

○ (B) RAPID COOLING IN HIGH TEMPERATURE RANGE
   + GRADUAL COOLING IN MEDIUM TEMPERATURE RANGE
   WITH STRUCTURE OF PRESENT INVENTION

● (C) RAPID COOLING IN HIGH TEMPERATURE RANGE
   + RAPID COOLING IN MEDIUM TEMPERATURE RANGE
   WITH TRADITIONAL STRUCTURE

▲ (A) GRADUAL COOLING IN HIGH TEMPERATURE RANGE
+ RAPID COOLING IN MEDIUM TEMPERATURE RANGE

○ (B) RAPID COOLING IN HIGH TEMPERATURE RANGE
+ GRADUAL COOLING IN MEDIUM TEMPERATURE RANGE
WITH STRUCTURE OF PRESENT INVENTION

● (C) RAPID COOLING IN HIGH TEMPERATURE RANGE
+ RAPID COOLING IN MEDIUM TEMPERATURE RANGE
WITH TRADITIONAL STRUCTURE

▲ (A) GRADUAL COOLING IN HIGH TEMPERATURE RANGE
  + RAPID COOLING IN MEDIUM TEMPERATURE RANGE

○ (B) RAPID COOLING IN HIGH TEMPERATURE RANGE
  + GRADUAL COOLING IN MEDIUM TEMPERATURE RANGE
  WITH STRUCTURE OF PRESENT INVENTION

● (C) RAPID COOLING IN HIGH TEMPERATURE RANGE
  + RAPID COOLING IN MEDIUM TEMPERATURE RANGE
  WITH TRADITIONAL STRUCTURE

FIG. 5(a)
FIG. 5(b)
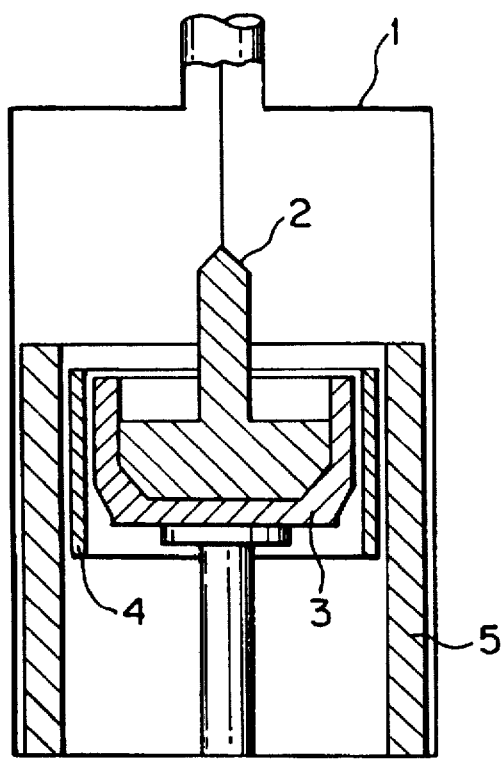
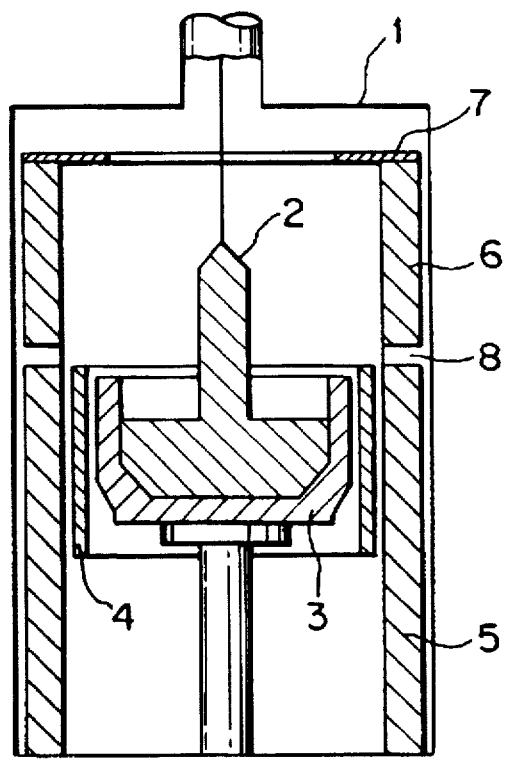

——— (B) RAPID COOLING IN HIGH TEMPERATURE RANGE
+ GRADUAL COOLING IN MEDIUM TEMPERATURE RANGE
WITH STRUCTURE OF PRESENT INVENTION

----- (C) RAPID COOLING IN HIGH TEMPERATURE RANGE
+ RAPID COOLING IN MEDIUM TEMPERATURE RANGE
WITH TRADITIONAL STRUCTURE

—○— (B) RAPID COOLING IN HIGH TEMPERATURE RANGE
+ GRADUAL COOLING IN MEDIUM TEMPERATURE RANGE
WITH STRUCTURE OF PRESENT INVENTION

--●-- (C) RAPID COOLING IN HIGH TEMPERATURE RANGE
+ RAPID COOLING IN MEDIUM TEMPERATURE RANGE
WITH TRADITIONAL STRUCTURE

SILICON SINGLE CRYSTAL WITH LOW DEFECT DENSITY AND METHOD OF PRODUCING SAME

BACKGROUND OF THE INVENTION

1. Field of the Invention

The present invention relates to a method of producing a silicon single crystal of an improved dielectric breakdown strength in oxides with a high productivity by means of the Czochralski technique or the pulling technique.

2. Related Prior Art

The recent miniaturization trend of components in a chip following the large scale integration of a semiconductor circuit has demanded a thinner dielectric oxide film of the gate in the MOS-LSI. Even with such a thinner dielectric oxide film, not only a high dielectric breakdown strength but also low current leakage are retained requirements for a semiconductor device being active, or in other words a high reliability of the oxide film is in a great demand.

It is known that the dielectric breakdown strength in oxide on a silicon wafer produced from a silicon single crystal grown by means of the Czochralski technique is generally much lower than those on a silicon wafer from the floating zone melting technique or on an epitaxial wafer that is produced by depositing a silicon single crystal thin film on a silicon single crystal wafer grown by means of the Czochralski technique ( see Mitsumasa KOYANAGI: "Submicron Device II-3 Reliability of the Gate Oxide Film" published by Maruzen K. K. Tokyo, page 70).

A major cause of degrading the dielectric breakdown strength in oxide on a silicon wafer from the Czochralski technique has been established to be grown-in crystal defects during the growth. It is also well known that a dieletric breakdown strength in oxide on a silicon single crystal grown by means of the Czochralski technique can be greatly improved by lowering a crystal growth rate to an extremely low value, for example, of 0.4 mm/min. or lower (see a publication of Unexamined Japanese Patent Application No. Hei 2-267195).

However, when a crystal growth rate is simply lowered from a traditional value of 1 mm/min. or more to a newly proposed value of 0.4 mm/min. or lower in order to improve the dielectric breakdown strength in oxides, productivity of single crystals becomes decreased by half or by more than half compared with that when a traditional growth rate is applied. With such a low growth rate, tremendous increase in the production cost of a single crystal is resulted, though the improvement of dielectric breakdown strength in oxides is attained.

SUMMARY OF THE INVENTION

In light of the above problems which the conventional technology had, the present invention was made to solve them.

It is an object of the present invention to provide a method of producing a silicon single crystal of an improved dielectric breakdown strength in oxides with a high productivity grown by means of the Czochralski technique.

The present invention was completed through investigations into and studies on relations between the history of thermal conditions under which a single crystal has been growing and grown-in defects in a Czochralski technique. The present invention is directed to a method of producing a silicon single crystal by means of the Czochralski technique comprising the steps of: adjusting a first period required for a growing silicon single crystal to pass a first temperature range from the melting point of silicon (about 1,420° C.) to 1,200° C. in a puller so as to be 190 min. or less; and adjusting a second period for the growing crystal to pass a second temperature range from 1,150° C. to 1,080° C. in the puller so as to be 60 min. or more, preferably 70 min. or more, and further directed to a silicon single crystal produced by the same method.

Explanations on the terminology used in the following description will be given below and followed by details of the present invention.

1) FPD is an abbreviation for Flow Pattern Defect and a wavelet observable on a treated wafer surface is called FPD. The wavelet is appeared on a wafer surface singly or plurally after a process comprising the steps of: obtaining the wafer slicing an as-grown silicon single crystal; removing the strained surface region by a mixed liquid of hydrofluoric acid and nitric acid, and then further etching the wafer surface with another mixed liquid of hydrofluoric acid and water with $K_2Cr_2O_7$ as solute to develop pits and wavelets on the surface. A silicon wafer with a larger number of FPDs in a unit surface area shows poorer dielectric breakdown strength in oxides thereon (see a publication of Unexamined Japanese Patent Application No. Hei 4-192345).

2) LSTD, which is an abbreviation for Laser Scattering Tomography Defect, is a defect which causes scattered radiation which is detected through a polished surface of a silicon wafer when an incident infrared beam is impinged on a cleaved plane of the silicon wafer, the silicon wafer having been in advance of testing etched to remove the strained surface region with a mixed liquid of hydrofluoric acid and nitric acid and then cleaved in preparation for testing. The cause of the scattered radiation is assumed an oxygen deposit in the bulk of the silicon wafer. Reports on the scatterers thus detected have been made in meetings of academic societies or related journals (see, for example, Shinsuke SADAMITSU et al.,: Jpn. J. Appl. Phys. Vol. 32 (1993) pp. 3675–3681).

Theses FPD and LSTD are believed to be factors which cause degradation of the dielectric breakdown strength in oxides, since each density in a bulk or surface has a correlation with a fraction of defectives. From the observation, a conclusion is deduced that it is necessary that FPD and LSTD should be decreased in order to have improved dielectric breakdown strength in oxides on a silicon single crystal grown by means of the Chohralski technique.

The inventors investigated into a mechanism in which, with a lowered crystal growth rate, densities of FPDs and LSTDs are decreased and at the same time the dielectric breakdown strength in oxides are improved. In this investigation, the inventors employed two types of furnace structure one of which is suitable for gradual cooling and the other for rapid cooling. It was discovered from the results of experiments that when a crystal growth rate was lowered rapidly from a previous higher growth rate, it was before the turning point in growth rate that the densities of FPDs and LSTDs was rapidly decreased. This fact means the decrease in the densities occurred in a already grown portion.

A changing point of the densities is different in dependence of a different type of furnace structure. In a type of rapid cooling furnace structure, a changing point of the densities is located at a point of a distance of about 14 cm to 11 cm prior to a turning point in growth rate (in a region between a point A and a point B on a single crystal shown in FIG. 1(a)). In a type of gradual cooling furnace structure, a changing point of the densities is located at a point of a distance of about 19 cm to 16 cm prior to the turning point in growth rate (in a region between a point A' and a point B' on a single crystal shown in FIG. 1(a)). The inventors made an additional discovery in further investigation that temperatures corresponding to the changing points of the densities fall in a range of 1,150° C. to 1,080° C. (see FIG. 1(b)). That is, since the respective temperatures at the points A and A', each of which is 1,080° C., on the growing crystals at the starting times when growth rates of both cases were rapidly changed was the lowest temperature in a range capable of affecting densities of FPDs and LSTDs, the respective densities FPDs and LSTDs at the points A and A' were not so different from the densities in the top region of the growing crystal. It is because a period of time for the growing crystal to pass a temperature range from 1,150° C. to 1,080° C. became continuously longer in a portion grown later owing to the decrease in growth rate that densities of FPDs and LSTDs were rapidly lowered respectively between the points A and B and between the points A' and B' In respective regions between the points B or B' and the changing point in growth rate on the respective growing crystals, densities of FPDs and LSTDs were respectively kept constant, because the growing crystals can pass the temperature range from 1,150° C. to 1,080° C. in a constant time, the former of which is the highest temperature capable of affecting the densities.

The above-mentioned experimental results tell that a temperature region from 1,150° C. to 1,080° C. affects the process of annihilation of the crystal defects during crystal growth and further that a temperature gradient in a region in the vicinity of the melting points, in other words, a temperature gradient in a high temperature range from a temperature of 1,200° C. to the melting point, which affects a growth rate, gives no influence on the process of annihilation of the defects.

If a crystal growth rate is lowered to excess, the whole growing crystal spends a long time to pass any temperature ranges and therefore a time for passing a range of 1,150° C. to 1,080° C. gets also longer enough to considerably decrease densities of FPDs and LSTDs and thereby improve the dielectric breakdown strength in oxides.

As a conclusion, if only a period of time for a growing crystal to pass a temperature range of 1,150° C. to 1,080° C. can be kept longer enough, there is no need for extending periods of time for a growing crystal to pass other temperature ranges, especially to pass a high temperature range from the melting point to 1,200° C., which affects a crystal growth rate, and therefore a higher crystal growth rate can be realized while attaining great decrease in densities of the defects.

The inventors designed two types of furnace structure by means of the numerical analysis method setting a border line at about 1,200° C., in a first type (A) of which a gradual cooling prevails in a temperature range of 1,200° C. or higher and a rapid cooling prevails at a temperature range of 1,200° C. or lower, and in the other type (B) of furnace structure of which a rapid cooling prevails at a temperature range of 1,200° C. of higher and a gradual cooling prevails in a range of 1,200° C. or lower, or more particularly in a range between 1,150° C. and 1,080° C. The newly designed furnace structures (A) and (B) were actually used to grow crystals respectively and crystals grown were compared with crystals from a traditional type (C) of furnace structure in which a rapid cooling prevails, in both temperature ranges higher and lower than 1,200° C. The results of the comparison are shown in FIGS. 2(a), 2(b), 3(a) and 3(b) wherein FPD or LSTD on ordinates as functions of passage times are plotted on respective abscissas in ranges between the melting point and 1,200° C. in FIGS. 2(a) and 3(a) or between 1,150° C. and 1,080° C. in FIGS. 2(b) and 3(b).

It can be seen from FIGS. 2(a), 2(b), 3(a) and 3(b) that the FPD and LSTD have no correlation with the passage time between the melting point and 1,200° C. and has a good correlation with the passage time between 1,150° C. and 1,080° C. That is, in the case of (A) that a gradual cooling is only applied to a temperature region of 1,200° C. or higher, neither the FPD nor LSTD decreases and both defect densities increased to higher values than those in a traditional case (C). However, in the case (B) that a gradual cooling was applied in a temperature range between 1,150° C. and 1,080° C. while the same crystal growth rate as in the traditional case (C) was adopted, it was found that even with a rapid cooling applied in a temperature range of 1,200° C. or higher, the FPD and LSTD each decreased to a value by half or more than half lower than those in the traditional case (C).

Further experiments similar to those above mentioned were conducted in a variety of types of furnace structure. In the experiments, a correlation was investigated between the FPD and a passage time from 1,150° C. to 1,080° C. and the results were that a very good correlation was seen therebetween as shown in FIGS. 4(a) and 4(b). Especially, in the case of a passage time of 60 min. or longer, it was found that a FPD density decreases to a value of 500 FPDs/cm$^2$ or lower and in the case of a passage time of 70 min. or longer a FPD density further decreases to a value of 400 FPDs/cm$^2$ or lower.

A C-mode non-defective ratio of a dielectric breakdown strength test in oxides under an electric field strength of 8 MV/cm, which has a correlation with a FPD density, improved with an increased passage time. A C-mode non-defective ratio of a dielectric breakdown strength test in oxides under the same electric field strength with an increased passage time of 60 min. or longer for a range between 1,150° C. and 1,080° C. according to the present invention reached to a value of as high as 80% or higher as the case (B) shown in FIG. 7 and such a non-defective ratio was greatly higher in contrast with a ratio in the traditional case (C) shown in FIG. 7, in which a C-mode non-defective ratio fell in a range of 40% to 60%.

It was found from the above results that a gradual cooling in a temperature range between 1,150° C. to 1,080° C., in the course of growth makes it possible to obtain a silicon single crystal with high dielectric breakdown strength in oxides thereon. An easy way to adjust a passage time to a value of 60 min. or longer may be to choose an extremely low growth rate of 0.4 mm/min. or less. However, in this case, the productivity becomes very low as described above and therefore the object of the present invention cannot be attained. With a traditional furnace structure, it is difficult to gradually cool a growing crystal in this particular temperature range only and therefore when choosing an extremely low growth rate, a temperature gradient in the vicinity of the melting point in the bulk becomes smaller. The difficulty in limiting a gradual cooling to such a specified temperature range makes it indispensable to reduce a growth rate by 10% or more.

The inventors of the present invention estimated temperatures in the bulk of a growing crystal in a variety of furnace structures by the numeral analysis method and devised a furnace structure suitable for limiting a gradual cooling process to the temperature range according to the present invention from the results thus obtained by the analysis method. Such a furnace structure is, as shown in FIG. 5(b), to extend a hollow heat insulating cylinder 5 surrounding a heater 4 upward and place a carbon ring 7 on the upper end of the heat insulating cylinder 5. The extension of the heat insulating cylinder 5 and carbon ring 7 are not present in a traditional furnace structure (FIG. 5(a)). The heat insulating cylinder 5 has an annular gap 8 for thermal separation in the mid portion between the upper part and lower part to successfully limit a rapid cooling process to a higher temperature range only. The annular separation gap 8 functions so as to increase a radiation loss from the growing crystal surface passing the vicinity of the gap 8. A vertical position of the gap 8 is important by the reason above mentioned and it is necessary to locate the gap 8 at a position at least higher than the height of the melt surface. A variety of analyses were done in regard to a width of the opening of the annular gap 8 and the results were such that the maximal width should be 10 cm because the effect of a gradual cooling in a temperature range of 1,150° C. to 1,080° C. was lost if a width of the gap was very large.

A temperature profile along the length of a growing crystal in such a furnace structure was measured and the results were, as shown in FIGS. 6(a) and 6(b), that a passage time in a higher temperature range was made shorter and a passage time in a temperature range between 1,150° C. and 1,080° C. was made longer compared with that in a traditional furnace structure. In FIG. 6(b), a time required for growing crystal to pass a temperature difference of 50° C. is plotted on an ordinate as a function of a temperature of the growing crystal on an abscissa.

According to the present invention, it becomes possible to decrease an absolute density of crystal defect nuclei, since a passage time for a growing crystal in a temperature range between 1,150° C. and 1,080° C. gets about 1.6 times as long as that in a traditional furnace structure and thereby a point defect is annihilated. What's more, according to the present invention, since a temperature gradient in a higher temperature range in the vicinity of the melting point, which gradient does not affect the magnitude of a point defect density, can be made steep, a silicon crystal with a low defect density can be grown at a growth rate by about 10% higher than that in a traditional furnace structure.

BRIEF DESCRIPTION OF THE DRAWINGS

The novel features which are considered characteristic of the present invention are set forth with particularity in the appended claims. The present invention itself, however, and additional objects and advantages thereof will best be understood from the following description of embodiments thereof when read in connection with the accompanying drawings, in which:

FIG. 5(a) is a schematic view in a longitudinal section of a furnace for crystal growth having a traditional structure used in the Czochralski technique, in which a rapid cooling prevails along the entire growth length.

FIG. 5(b) is a schematic view in a longitudinal section of a furnace for crystal growth having a structure according to the present invention used in the Czochralski technique, in which a gradual cooling is applied in a temperature range from 1,150° C. to 1,200° C.

DETAILED DESCRIPTION OF THE INVENTION

Figure 1B:
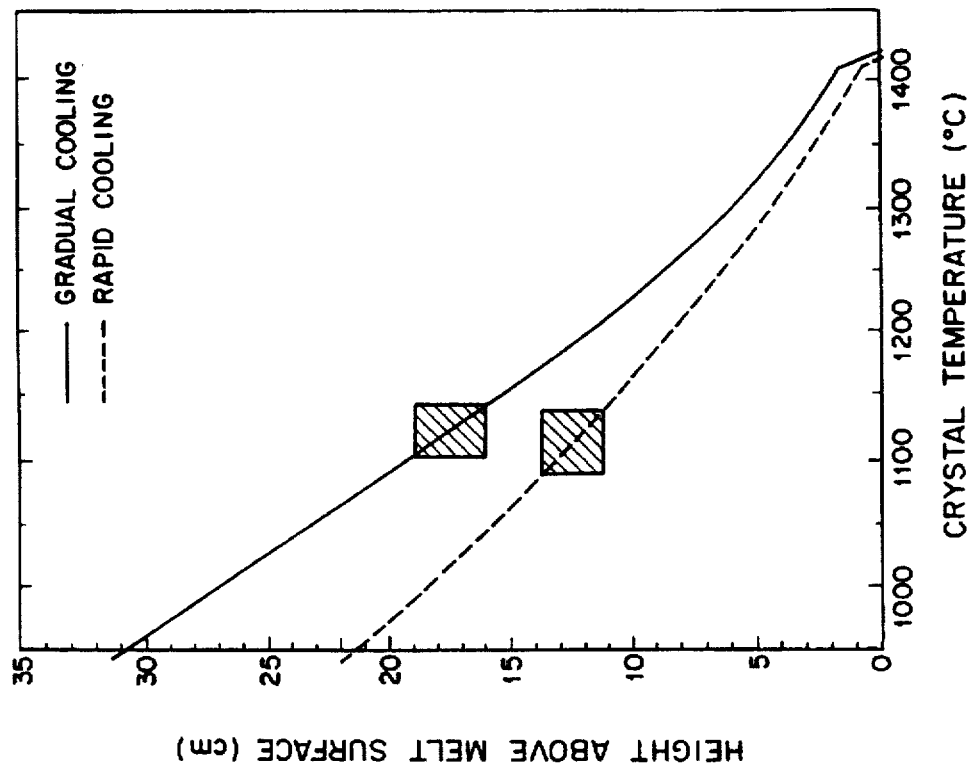
FIG. 1(b) is a graph showing a relationship between a position measured in height above the melt surface and a temperature at the position during crystal growth.
Figure 1A:
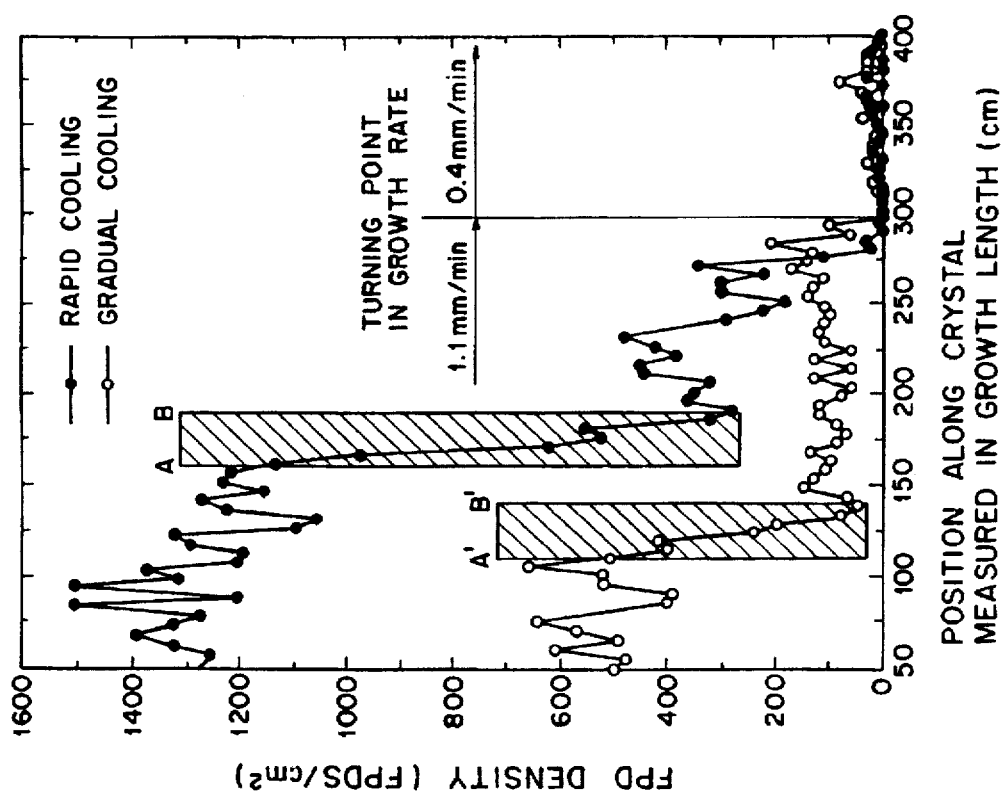
FIG. 1(a) is a graph showing a relationship between a position measured in growth length and a FPD density at the position during crystal growth when a growth rate was rapidly changed in the course.
Figure 2B:
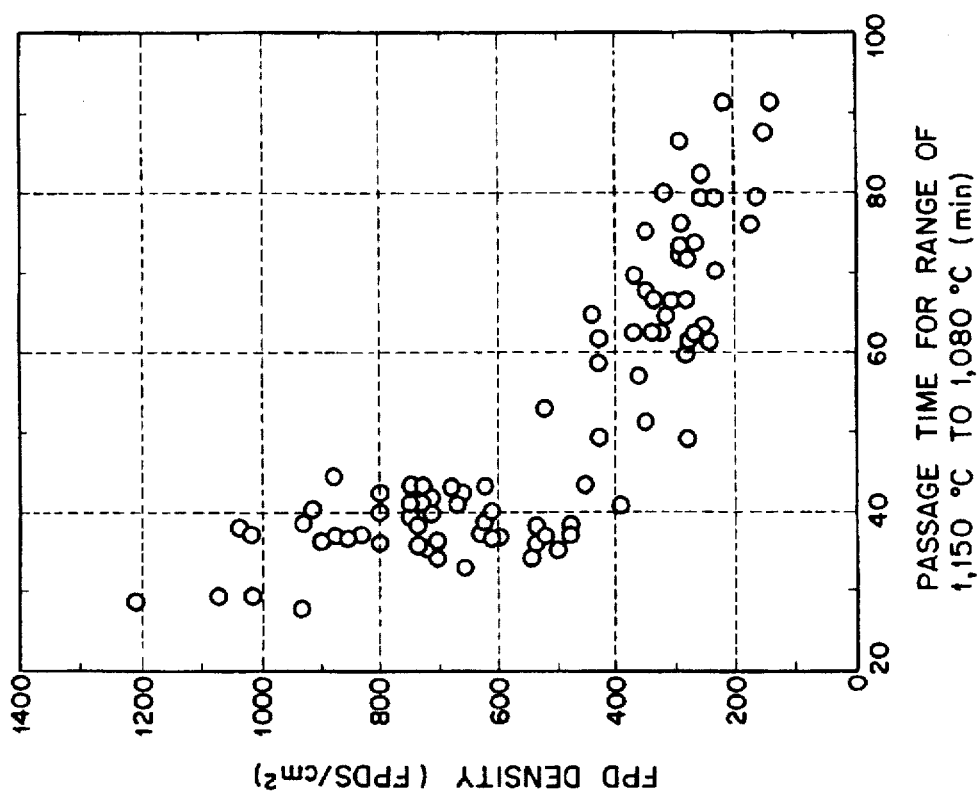
FIG. 2(b) is a graph showing a relationship between a passage time of a temperature range from 1,150° C. to 1,080° C. and a FPD density during crystal growth.
Figure 2A:
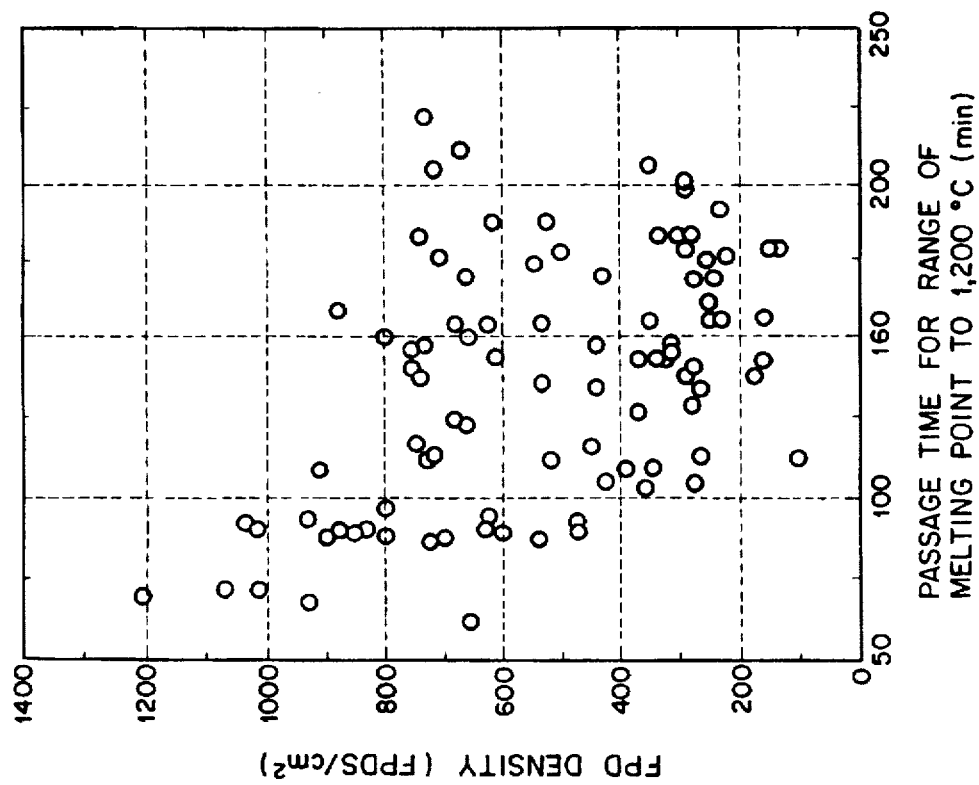
FIG. 2(a) is a graph showing a relationship between a passage time of a temperature range from the melting point to 1,200° C. and a FPD density during crystal growth.
Figure 3B:
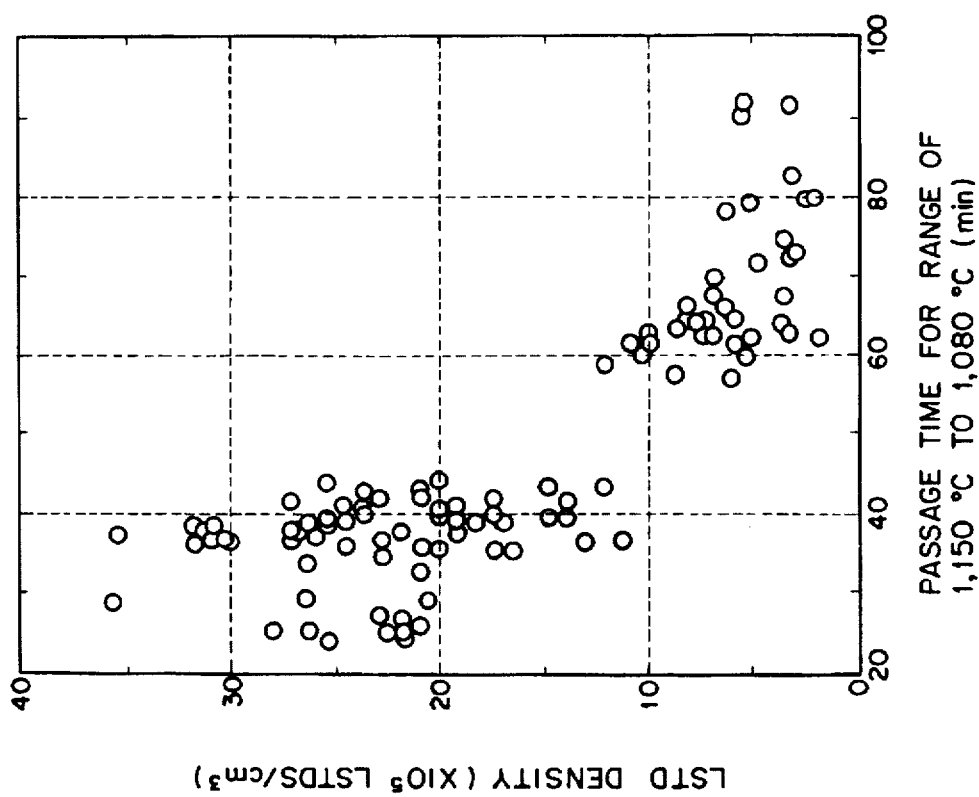
FIG. 3(b) is a graph showing a relationship between a passage time of a temperature range from 1,150° C. to 1,080° C. and a LSTD density during crystal growth.
Figure 3A:
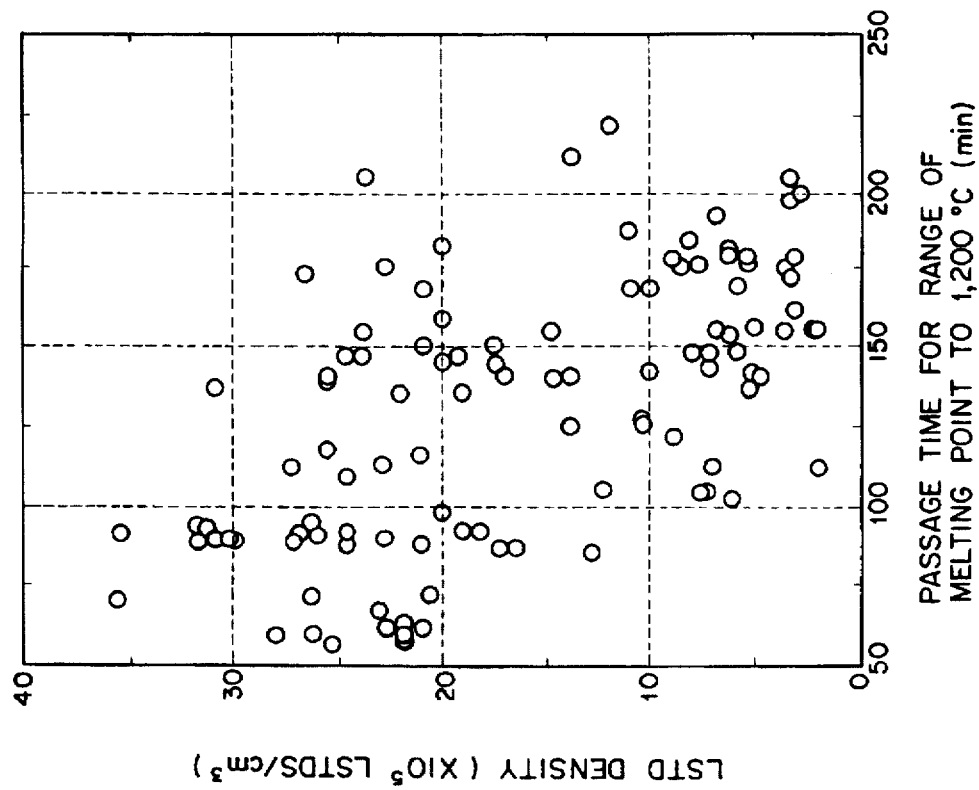
FIG. 3(a) is a graph showing a relationship between a passage time of a temperature range from the melting point to 1,200° C. and a LSTD density during crystal growth.
Figure 4A:
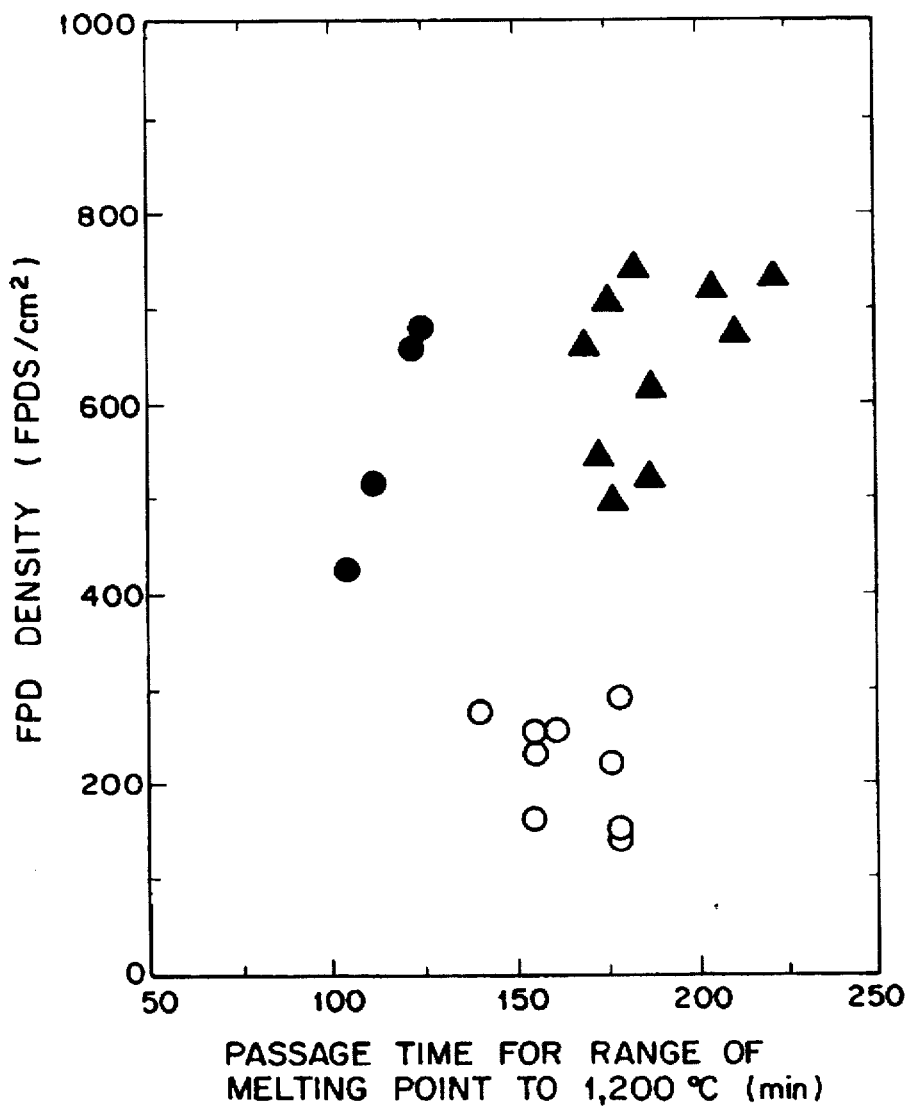
FIG. 4(a) is a graph with plots of different marks showing relationships each of which is one between a passage time of a temperature range from the melting point to 1,200° C. and a FPD density in each of different furnace structures during crystal growth.
Figure 4B:
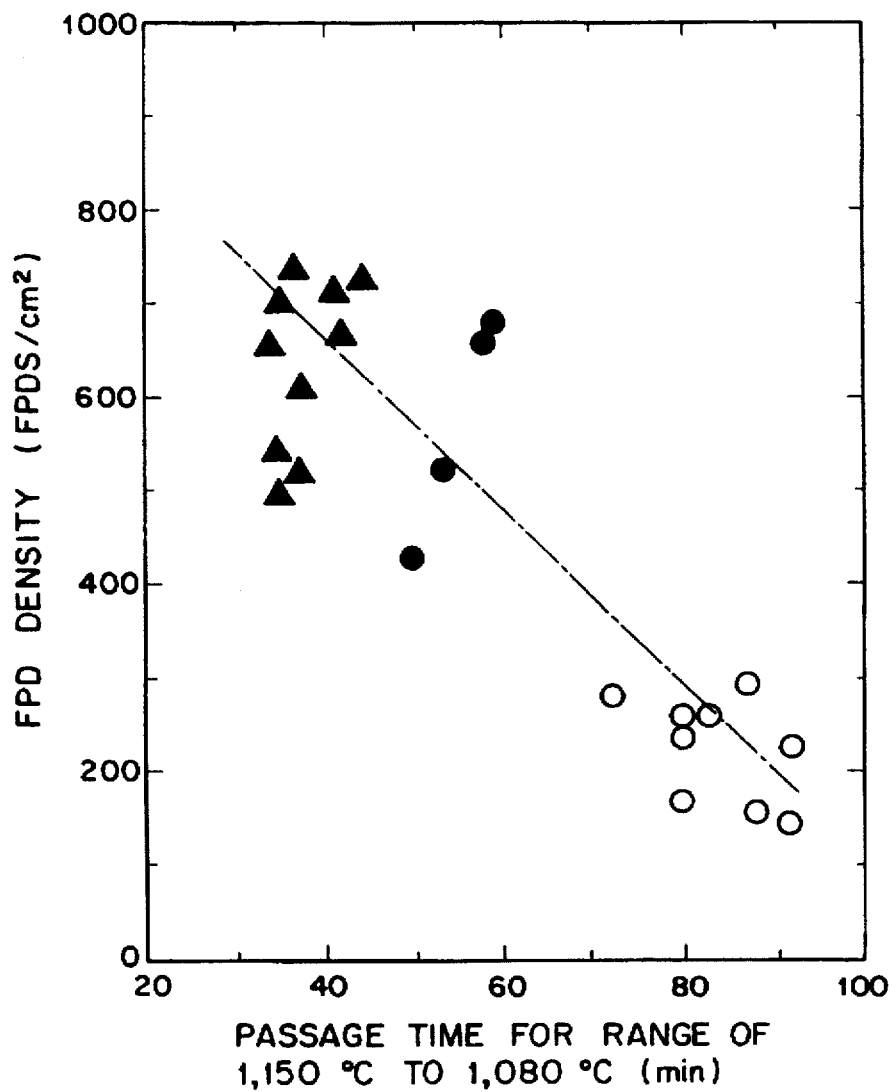
FIG. 4(b) is a graph with plots of different marks showing relationships each of which is one between a passage time of a temperature range from 1,150° C. to 1,080° C. and a FPD density in each of different furnace structures during crystal growth.
Figure 6A:
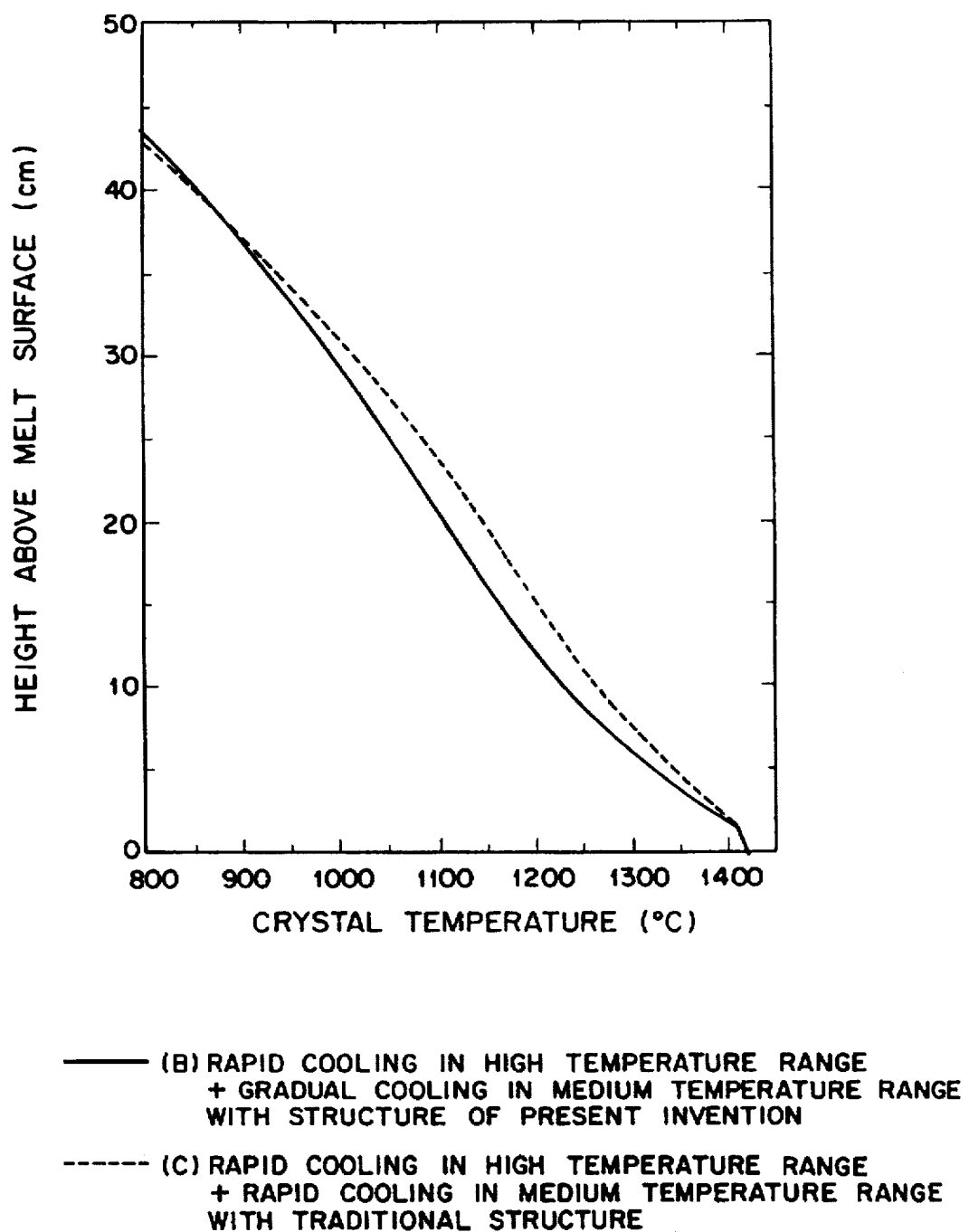
FIG. 6(a) is a graph showing relationship of a crystal temperature between the height above the melt surface at which the temperature is measured during crystal growth.
Figure 6B:
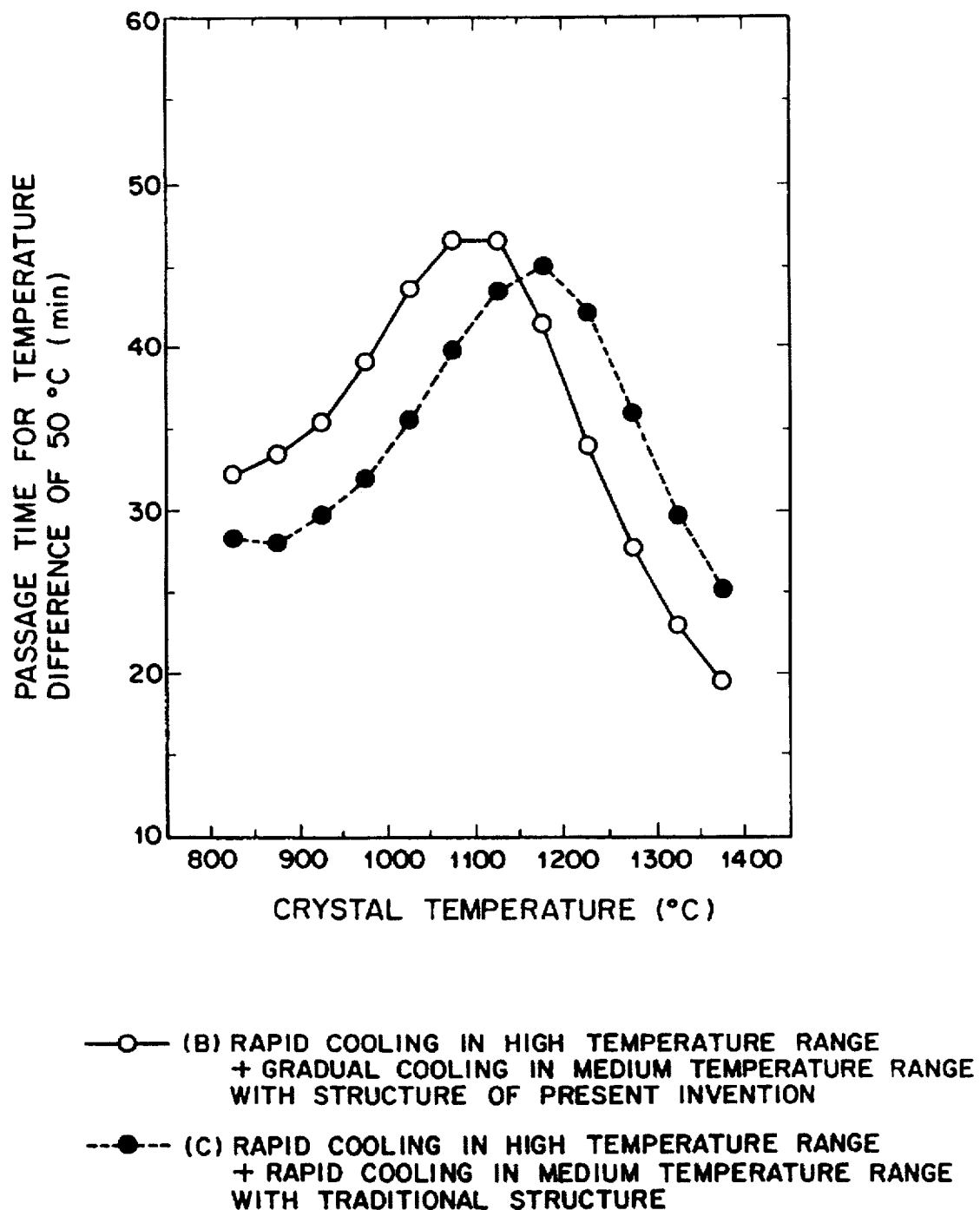
FIG. 6(b) is a graph showing relationship of a crystal temperature between a passage time for a temperature difference at the temperature during crystal growth.
Figure 7:
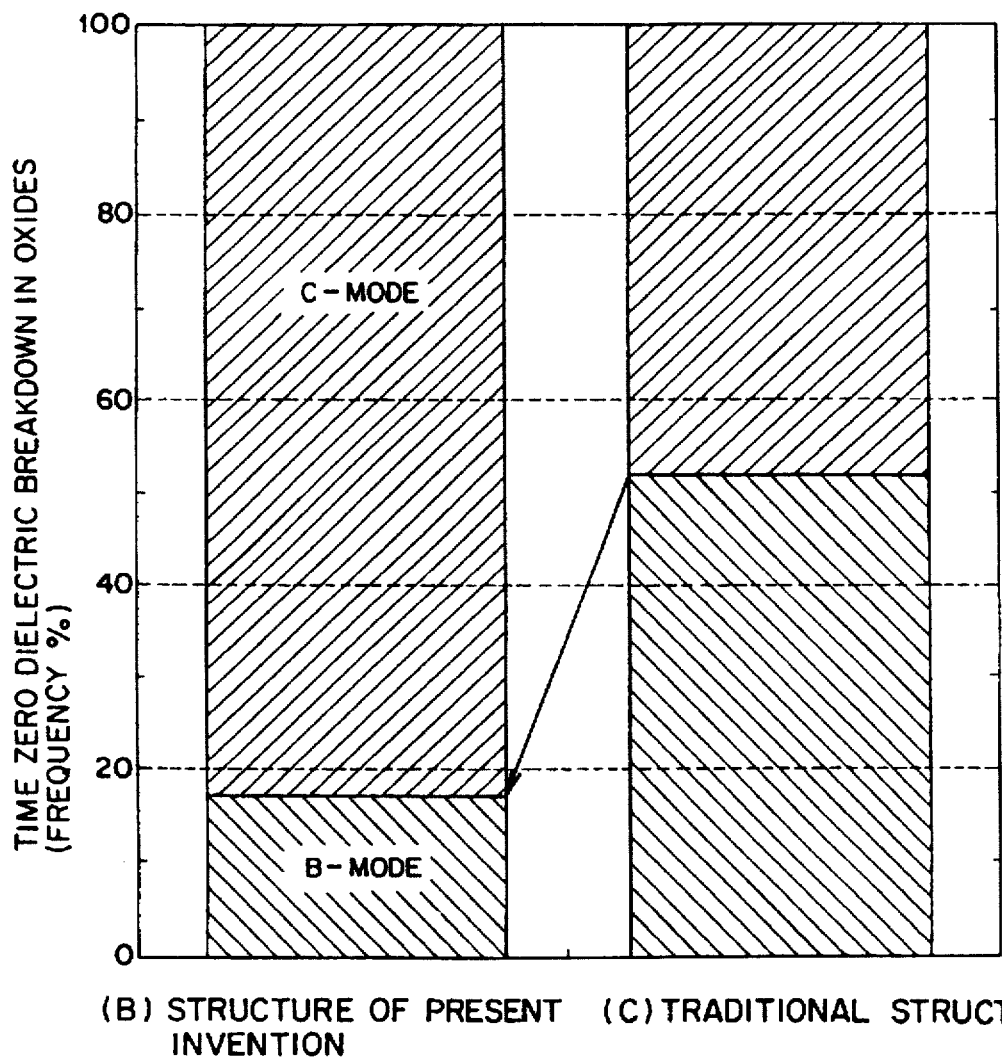
FIG. 7 is a graph comparatively showing characteristics of dielectric breakdown strength in oxide in various mode, in which C shows the characteristics of a crystal grown with a traditional furnace structure and B shows those of another crystal which passed a temperature range of 1,150° C. to 1,200° C. in 60 min. or longer during crystal growth.

Below, description will be given about examples according to the present invention and a comparative example in reference to accompanying drawings.

In the Czochralski technique, a silicon single crystal having a diameter of 6 inches and a growth orientation of <100> was grown in a quartz crucible of a diameter of 18 inches and with 50 kg of polycrystal silicon charged as a raw material in a furnace of a traditional structure as shown in FIG. 5(a) or a furnace of a structure according to the present invention as shown in FIG. 5(b). As furnace structures in the examples, two types were tried, one of which has a width of the opening of a separation gap of 8 cm. and the other has 4 cm. FPD and LSTD densities measured are shown in Table 1 together with respective average growth rates.

TABLE 1

| | Av. growth rate (mm/min.) | FPD density (/cm$^2$) | LSTD density (/cm$^3$) |
|---|---|---|---|
| Examples | | | |
| Sep. Gap 8 cm | 1.10 | $\bar{X} = 350, n = 9$ | $\bar{X} = 8.1 \times 10^5$ |
| Sep. gap 4 cm | 1.00 | $\bar{X} = 220, n = 9$ | $\bar{X} = 3.6 \times 10^5$ |
| Comp. Example | 1.00 | $\bar{X} = 650, n = 18$ | $\bar{X} = 2.0 \times 10^6$ |

It can be seen from the results shown in Table 1 that the examples showed great effects of decreasing FPD and LSTD densities in comparison of the data with those of the comparative example, even though growth rates in the examples larger than or equal to that of the comparative example.

What is claimed is:

1. A method of producing a silicon single crystal by means of a Czochralski technique comprising a step of adjusting a passage time of a growing crystal for a temperature range of 1,150° C. to 1,080° C. so as to be 60 min. or longer during crystal growth.

2. The method of claim 1, wherein said passage time is adjusted so as to be 70 min. or longer during crystal growth.

3. A silicon single crystal produced by the method of claim 2.

4. A silicon single crystal produced by the method of claim 1.

5. A method of producing a silicon single crystal by means of a CzoChralski technique comprising steps of adjusting a first passage time of a growing crystal for a first temperature range of the melting point to 1,200° C. so as to be 190 min. or shorter and adjusting a second passage time of the growing crystal for a second temperature range of 1,150° C. to 1,080° C. so as to be 60 min. or longer during crystal growth.

6. The method of claim 5, wherein said second passage time is adjusted so as to be 70 min. or longer during crystal growth.

7. A silicon single crystal produced by the method of claim 6.

8. A silicon single crystal produced by the method of claim 5.

* * * * *